(12) United States Patent
Suzuki et al.

(10) Patent No.: US 10,418,559 B2
(45) Date of Patent: Sep. 17, 2019

(54) SOLVENT OR SOLVENT COMPOSITION FOR ORGANIC TRANSISTOR PRODUCTION

(71) Applicant: DAICEL CORPORATION, Osaka-shi, Osaka (JP)

(72) Inventors: Youji Suzuki, Himeji (JP); Takeshi Yokoo, Himeji (JP); Yasuyuki Akai, Himeji (JP)

(73) Assignee: DAICEL CORPORATION, Osaka-Shi (JP)

( * ) Notice: Subject to any disclaimer, the term of this patent is extended or adjusted under 35 U.S.C. 154(b) by 227 days.

(21) Appl. No.: 14/404,832

(22) PCT Filed: Jun. 3, 2013

(86) PCT No.: PCT/JP2013/065356
§ 371 (c)(1),
(2) Date: Dec. 1, 2014

(87) PCT Pub. No.: WO2013/187275
PCT Pub. Date: Dec. 19, 2013

(65) Prior Publication Data
US 2015/0144845 A1 May 28, 2015

(30) Foreign Application Priority Data

Jun. 12, 2012 (JP) ................. 2012-132904
Oct. 18, 2012 (JP) ................. 2012-230693

(51) Int. Cl.
*H01L 51/00* (2006.01)
*H01L 51/05* (2006.01)

(52) U.S. Cl.
CPC ...... *H01L 51/0054* (2013.01); *H01L 51/0007* (2013.01); *H01L 51/0055* (2013.01); *H01L 51/0074* (2013.01); *H01L 51/0558* (2013.01)

(58) Field of Classification Search
CPC ........................................................ H01B 1/12
See application file for complete search history.

(56) References Cited

U.S. PATENT DOCUMENTS

| 3,723,417 | A | * | 3/1973 | Perez-Alberne | C07D 327/00 252/500 |
| 4,772,755 | A | * | 9/1988 | Liotta | C07C 45/60 552/293 |
| 7,772,622 | B2 | | 8/2010 | Fujimori et al. | |
| 8,440,713 | B2 | * | 5/2013 | Goto | C07D 495/04 514/443 |
| 2003/0116755 | A1 | * | 6/2003 | Takahashi | C07C 17/16 252/500 |
| 2006/0231832 | A1 | * | 10/2006 | Tokunaga | C07D 277/66 257/40 |
| 2007/0092743 | A1 | | 4/2007 | Yun et al. | |
| 2007/0252229 | A1 | | 11/2007 | Fujimori et al. | |
| 2009/0043113 | A1 | * | 2/2009 | Park, II | C07D 495/04 549/41 |
| 2011/0040107 | A1 | | 2/2011 | Goto et al. | |
| 2011/0136282 | A1 | | 6/2011 | Shirasawa et al. | |
| 2011/0204297 | A1 | * | 8/2011 | Park | H01B 1/24 252/503 |
| 2013/0095605 | A1 | | 4/2013 | Goto et al. | |

FOREIGN PATENT DOCUMENTS

| CN | 102007131 A | 4/2011 |
| CN | 102079876 A | 6/2011 |
| CN | 102113413 A | 6/2011 |
| JP | 2005-216966 A | 8/2005 |
| JP | 2006-248948 A | 9/2006 |
| JP | 2007-294704 A | 11/2007 |
| JP | 2010-093092 A | 4/2010 |
| TW | 201002674 A1 | 1/2010 |
| WO | WO 2011/158953 A1 | 12/2011 |

OTHER PUBLICATIONS

International Search Report issued in PCT/JP2013/065356 dated Aug. 13, 2013.
Payne et al., "Organic Field-Effect Transistors from Solution-Deposited Functionalized Acenes with Mobilities as High as 1 cm/V•s", vol. 127, No. 14, J. Am. Chem. Soc., pp. 4986-4987, 2005.
Office Action issued in Taiwanese Patent Application No. 102120633 dated Nov. 7, 2016 (with English-Language Translation).
Anthony et al, "Functionalized Pentacene: Improved Electronic Properties from Control of Solid-State Order," Journal of the American Chemical Society, vol. 123, No. 38, 2001 (Published on the web Aug. 30, 2001), pp. 9482-9483.
Japanese Notification of Reasons for Refusal dated May 16, 2017, for Japanese Application No. 2014-521272, with English translation.
Chinese Office Action, dated May 21, 2018, for Chinese Application No. 201380029735.0, along with an English translation.

* cited by examiner

*Primary Examiner* — William D Young
(74) *Attorney, Agent, or Firm* — Birch, Stewart, Kolasch & Birch, LLP

(57) ABSTRACT

Solvent or solvent composition for organic transistor production, which is excellent in solubility of an organic semiconductor material, and which can form an organic transistor high in crystallinity. The solvent or solvent composition for organic transistor is a solvent or solvent composition for organic semiconductor material dissolution, and includes a solvent 'A' represented by the formula $(R^1)N(R^2)—C(=O)—(R^3)N(R^4)$ wherein $R^1$ to $R^4$ are the same or different, and each represents a $C_{1-2}$ alkyl group, or $R^1$ and $R^4$ may be bound to one another to form a ring together with the $—N(R^2)—C(=O)—N(R^3)—$ moiety as well as an organic semiconductor material.

8 Claims, No Drawings

SOLVENT OR SOLVENT COMPOSITION FOR ORGANIC TRANSISTOR PRODUCTION

TECHNICAL FIELD

The present invention relates to a solvent or solvent composition for organic transistor production excellent in solubility of an organic semiconductor material, and a composition for organic transistor production including the solvent or solvent composition for organic transistor production and an organic semiconductor material.

BACKGROUND ART

A transistor is widely utilized as an important semiconductor electronic device for constituting a display and computer equipment, and is currently produced using an inorganic material such as polysilicon and amorphous silicon for a semiconductor material. In production of a thin film transistor in which such an inorganic material is used, a vacuum process and a high-temperature process are required, and a problem is that a production cost is high. In addition, a high-temperature process is included to thereby limit a usable substrate, and, for example, a glass substrate is mainly used. The glass substrate, however, is high in heat resistance, but is poor in impact resistance, difficult to be lighter, poor in flexibility, and thus difficult to form a flexible transistor.

In recent years, an organic electronic device in which an organic semiconductor material is used has been actively researched and developed. The organic semiconductor material can easily form a thin film by a simple method by means of a wet process such as a printing method or a spin coat method, and has an advantage of allowing a production process temperature to be lowered, as compared with the case of a conventional transistor in which the inorganic semiconductor material is utilized. Thus, the thin film can be formed on a plastic substrate generally low in heat resistance, reductions in weight and cost of an electronics device such as a display can be realized, and various evolvements such as an application in which the flexibility of the plastic substrate is utilized can be expected.

It is known that a low-molecular semiconductor material such as pentacene is used as the organic semiconductor material to thereby exhibit a high semiconductor device performance. An unsubstituted acene type compound typified by pentacene, however, is often poor in solubility in a solvent due to strong intermolecular interaction by a n-conjugated system. Therefore, a composition for organic transistor production including such a compound in a high concentration cannot be prepared, and an organic semiconductor formed by a printing method has a small crystal grain and has the problems of being energized only by application of a high voltage, of peeling of an insulating film by application of a high voltage, or the like.

As a method for solving the above problems, Non Patent Literature 1 discloses use of a compound that is an acene type compound having a substituent for imparting solubility, as an organic semiconductor material. The acene type compound having a substituent, however, often has the problem of being low in charge mobility as compared with the unsubstituted acene type compound.

In addition, Patent Literatures 1 and 2 disclose that a solvent such as an aryl halide, typified by 1,2,4-trichlorobenzene, or tetralin excellent in solubility of an organic semiconductor material is used for dissolution with heating. A hardly-soluble organic semiconductor material, however, is required to be dissolved by dissolution with heating at high temperatures, and a problem is that the organic semiconductor material is precipitated by cooling in the subsequent coating process. Furthermore, the aryl halide has concerns about ecological toxicity, and is also problematic in terms of work safety.

CITATION LIST

Patent Literatures

Patent Literature 1: Japanese Patent Laid-Open No. 2007-294704
Patent Literature 2: Japanese Patent Laid-Open No. 2010-093092

Non Patent Literature

Non Patent Literature 1: J. Am. Chem. Soc., 2005, 127 (14), pp 4986-4987

SUMMARY OF INVENTION

Technical Problem

Accordingly, an object of the present invention is to provide a solvent or solvent composition for organic transistor production that is excellent in solubility of an organic semiconductor material and that can form an organic transistor high in crystallinity.

Another object of the present invention is to provide a composition for organic transistor production including the solvent or solvent composition for organic transistor production.

Solution to Problem

The present inventors have made intensive studies in order to solve the above problems, and as a result, have found that when a specific solvent or solvent composition is used, a high solubility of an organic semiconductor material can be realized even at relatively low temperatures, and an organic transistor can be formed by a printing method even on a plastic substrate low in heat resistance as compared with a glass substrate. In addition, it has also been found that when a substrate is coated with a composition for organic transistor production containing the solvent, an organic semiconductor material is crystallized by self-organizing action. Furthermore, it has been found that when the solvent is if necessary mixed with a solvent generally used in an electronic material application, coatability and drying property can be further enhanced. The present invention has been completed based on these findings.

That is, the present invention provides a solvent or solvent composition for organic transistor production that is a solvent or solvent composition for organic semiconductor material dissolution, including a solvent A represented by the following formula (A):

[Formula 1]

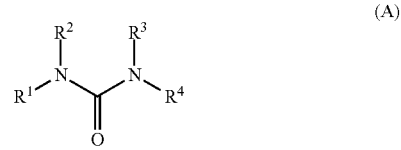

wherein $R^1$ to $R^4$ are the same or different, and represent a $C_{1-2}$ alkyl group; and $R^1$ and $R^4$ may be bound to each other to form a ring together with —N($R^2$)—C(=O)—N($R^3$)— in the formula.

The solvent A preferably includes at least one selected from 1,1,3,3-tetramethylurea, 1,3-dimethyl-2-imidazolidinone and 1,3-dimethyl-3,4,5,6-tetrahydro-2(1H)-pyrimidinone.

The organic semiconductor material is preferably at least one compound selected from compounds represented by the following formula (1), the following formula (2), the following formula (3) and the following formula (4). In the formula (1), $R^{11}$ and $R^{12}$ are the same or different, and represent a hydrogen atom, or a silylethynyl group optionally having a substituent. In the formula (2), $R^{13}$, $R^{14}$, $R^{15}$ and $R^{16}$ represent a phenyl group optionally having a substituent, or $R^{13}$ and $R^{14}$, and/or $R^{15}$ and $R^{16}$ are bound to each other to form a disulfide bond or an imide bond. In the formula (3), $R^{17}$ and $R^{18}$ are the same or different, and represent a hydrogen atom, a $C_{1-18}$ alkyl group optionally having a substituent, a phenyl group optionally having a substituent, a naphthyl group optionally having a substituent or a thiophenyl group optionally having a substituent. In the formula (4), $R^{19}$ and $R^{20}$ are the same or different, and represent a hydrogen atom, a $C_{1-18}$ alkyl group optionally having a substituent, a phenyl group optionally having a substituent, a naphthyl group optionally having a substituent or a thiophenyl group optionally having a substituent.

[Formula 2]

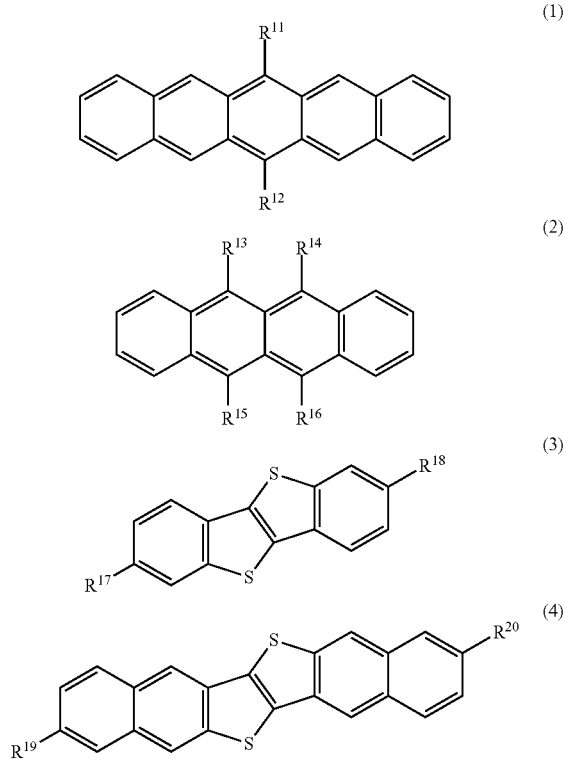

The present invention also provides a composition for organic transistor production including an organic semiconductor material, and the solvent or solvent composition for organic transistor production.

The organic semiconductor material is preferably at least one compound selected from compounds represented by the following formula (1), the following formula (2), the following formula (3) and the following formula (4). In the formula (1), $R^{11}$ and $R^{12}$ are the same or different, and represent a hydrogen atom, or a silylethynyl group optionally having a substituent. In the formula (2), $R^{13}$, $R^{14}$, $R^{15}$ and $R^{16}$ represent a phenyl group optionally having a substituent, or $R^{13}$ and $R^{14}$, and/or $R^{15}$ and $R^{16}$ are bound to each other to form a disulfide bond or an imide bond. In the formula (3), $R^{17}$ and $R^{18}$ are the same or different, and represent a hydrogen atom, a $C_{1-18}$ alkyl group optionally having a substituent, a phenyl group optionally having a substituent, a naphthyl group optionally having a substituent or a thiophenyl group optionally having a substituent. In the formula (4), $R^{19}$ and $R^{20}$ are the same or different, and represent a hydrogen atom, a $C_{1-18}$ alkyl group optionally having a substituent, a phenyl group optionally having a substituent, a naphthyl group optionally having a substituent or a thiophenyl group optionally having a substituent.

[Formula 3]

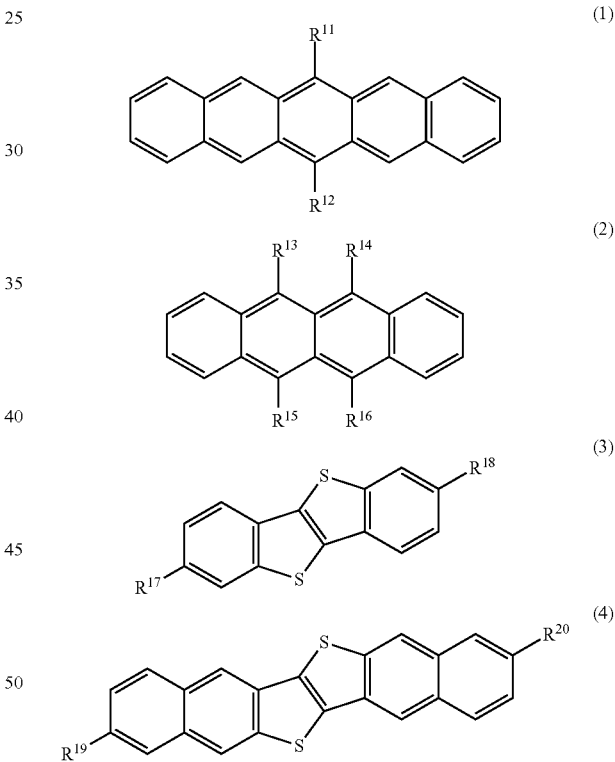

Advantageous Effects of Invention

The solvent or solvent composition for organic transistor production according to the present invention has a high solubility of an organic semiconductor material even at relatively low temperatures. Therefore, an organic transistor can be directly formed even on a plastic substrate or the like that is low in heat resistance, but is high in impact resistance, light in weight and flexible as compared with a glass substrate that is high in heat resistance, but is low in impact resistance, difficult to be lighter and poor in flexibility, thereby forming a display and computer equipment high in impact resistance, light in weight and flexible. In addition, an organic transistor can be easily produced by a simple method by means of a wet process such as a printing method or a spin coat method, resulting in a significant reduction in cost.

Then, when a substrate is coated with the composition for organic transistor production according to the present invention, an organic semiconductor material is crystallized by self-organizing action, providing an organic transistor having a high crystallinity.

DESCRIPTION OF EMBODIMENTS

[Solvent or Solvent Composition for Organic Transistor Production]

The solvent or solvent composition for organic transistor production according to the present invention is a solvent or solvent composition for organic semiconductor material dissolution, including a solvent A represented by the formula (A).

(Solvent A)

The solvent A in the present invention is represented by the formula (A). In the formula (A), $R^1$ to $R^4$ are the same or different, and represent a $C_{1-2}$ alkyl group. $R^1$ and $R^4$ may be bound to each other to form a ring together with —N($R^2$)—C(=O)—N($R^3$)— in the formula.

The $C_{1-2}$ alkyl group in $R^1$ to $R^4$ is a methyl group or an ethyl group.

Examples of the ring formed together with —N($R^2$)—C(=O)—N($R^3$)— in the formula by binding of $R^1$ and $R^4$ to each other can include a 2-imidazolidinone ring and a 3,4,5,6-tetrahydro-2(1H)-pyrimidinone ring.

The solvent A in the present invention can include 1,1,3,3-tetramethylurea, 1,1,3,3-tetraethylurea, 1,3-dimethyl-2-imidazolidinone and 1,3-dimethyl-3,4,5,6-tetrahydro-2(1H)-pyrimidinone. These can be used singly or in combination of two or more. In the present invention, among them, at least one compound selected from 1,3-dimethyl-2-imidazolidinone, 1,1,3,3-tetramethylurea and 1,3-dimethyl-3,4,5,6-tetrahydro-2(1H)-pyrimidinone is preferable because of being excellent in solubility of an organic semiconductor material. In particular, when the compound represented by the formula (2) (particularly, compound represented by formula (2-1)) is dissolved as the organic semiconductor material, the solvent A preferably contains at least 1,3-dimethyl-2-imidazolidinone or 1,3-dimethyl-3,4,5,6-tetrahydro-2(1H)-pyrimidinone.

The content (the total content in the case of a combination of two or more) of the solvent A in the solvent or solvent composition for organic transistor production (100% by weight) is preferably not less than 50% by weight (for example, 50 to 100% by weight), particularly preferably not less than 70% by weight (for example, 70 to 100% by weight). If the content of the solvent A is less than the above range, the solubility of the organic semiconductor material tends to be reduced.

(Solvent B)

In the solvent or solvent composition for organic transistor production according to the present invention, a solvent (=solvent B) other than the solvent A, which is a solvent generally used in an electronic material application and is compatible with the solvent A, may also be used in combination.

Examples of the solvent B can include (mono, di, tri) alkylene glycol monoalkyl ethers, (mono, di)alkylene glycol dialkyl ethers, (mono, di)alkylene glycol alkyl ether acetates, (mono, di)alkylene glycol diacetates, (cyclo)alkyl acetates, $C_{3-6}$ alcohols, $C_{3-6}$ alkanediols, $C_{3-6}$ alkanediol monoalkyl ethers, $C_{3-6}$ alkanediol alkyl ether acetates, $C_{3-6}$ alkanediol diacetates, glycerin triacetate, hydroxycarboxylic acid esters, hydroxycarboxylic acid diesters, alkoxycarboxylic acid esters, cyclic ketones, lactones, cyclic ethers, amides, pyridines, aromatic acetates and amines. These can be used singly or in combination of two or more.

Examples of the (mono, di, tri)alkylene glycol monoalkyl ethers can include ethylene glycol monomethyl ether, ethylene glycol monoethyl ether, ethylene glycol n-propyl ether, ethylene glycol n-butyl ether, diethylene glycol monomethyl ether, diethylene glycol monoethyl ether, diethylene glycol n-propyl ether, diethylene glycol n-butyl ether, propylene glycol monomethyl ether, propylene glycol monoethyl ether, propylene glycol n-propyl ether, propylene glycol n-butyl ether, dipropylene glycol monomethyl ether, dipropylene glycol monoethyl ether, dipropylene glycol n-propyl ether, dipropylene glycol n-butyl ether, tripropylene glycol monomethyl ether and tripropylene glycol n-butyl ether.

Examples of the (mono, di)alkylene glycol dialkyl ethers can include ethylene glycol dimethyl ether, ethylene glycol diethyl ether, diethylene glycol dimethyl ether, diethylene glycol diethyl ether, diethylene glycol dipropyl ether, diethylene glycol dibutyl ether, propylene glycol dimethyl ether, propylene glycol diethyl ether, dipropylene glycol dimethyl ether, dipropylene glycol diethyl ether, propylene glycol methyl ethyl ether, propylene glycol methyl n-propyl ether, propylene glycol methyl n-butyl ether, dipropylene glycol methyl ethyl ether, dipropylene glycol methyl n-propyl ether and dipropylene glycol methyl n-butyl ether.

Examples of the (mono, di)alkylene glycol alkyl ether acetates can include ethylene glycol monomethyl ether acetate, ethylene glycol monoethyl ether acetate, ethylene glycol monopropyl ether acetate, ethylene glycol monobutyl ether acetate, diethylene glycol monomethyl ether acetate, diethylene glycol monoethyl ether acetate, diethylene glycol monopropyl ether acetate, diethylene glycol monobutyl ether acetate, propylene glycol monomethyl ether acetate, propylene glycol monoethyl ether acetate, propylene glycol monopropyl ether acetate, propylene glycol monobutyl ether acetate, dipropylene glycol monomethyl ether acetate, dipropylene glycol monoethyl ether acetate, dipropylene glycol monopropyl ether acetate and dipropylene glycol monobutyl ether acetate.

Examples of the (mono, di)alkylene glycol diacetates can include ethylene glycol diacetate, diethylene glycol diacetate, propylene glycol diacetate and dipropylene glycol diacetate.

Examples of the (cyclo)alkyl acetates [=alkyl acetates or cycloalkyl acetates] can include methyl acetate, ethyl acetate, n-propyl acetate, isopropyl acetate, butyl acetate and cyclohexanol acetate.

Examples of the $C_{3-6}$ alcohols can include n-propyl alcohol, isopropyl alcohol, n-butyl alcohol, sec-butyl alcohol, tert-butyl alcohol, n-pentyl alcohol, n-hexyl alcohol and 2-hexyl alcohol.

Examples of the $C_{3-6}$ alkanediols can include 1,3-butanediol, 1,4-butanediol and 1,6-hexanediol.

Examples of the $C_{3-6}$ alkanediol monoalkyl ethers can include 3-methoxybutanol.

Examples of the $C_{3-6}$ alkanediol alkyl ether acetates can include 3-methoxybutanol acetate.

Examples of the $C_{3-6}$ alkanediol diacetates can include 1,3-butanediol diacetate, 1,4-butanediol diacetate and 1,6-hexanediol diacetate.

Examples of the hydroxycarboxylic acid esters can include methyl lactate and ethyl lactate.

Examples of the hydroxycarboxylic acid diesters can include methyl lactate acetate and ethyl lactate acetate.

Examples of the alkoxycarboxylic acid esters can include methyl methoxypropionate and ethyl ethoxypropionate.

Examples of the cyclic ketones can include cyclopentanone, cyclohexanone and 4-ketoisophorone.

Examples of the lactones can include β-butyrolactone, γ-butyrolactone, ε-caprolactone, δ-valerolactone, γ-valerolactone and α-acetyl-γ-butyrolactone.

Examples of the cyclic ethers can include tetrahydrofuran, tetrahydrofurfuryl alcohol and tetrahydrofurfuryl acetate.

Examples of the amides can include dimethylformamide.

Examples of the pyridines can include pyridine and methylpyridine.

Examples of the aromatic acetates can include phenyl acetate.

Examples of the amines can include diethylamine and triethylamine.

In the present invention, the solvent A and the solvent B can be used in combination to thereby allow a composition for organic transistor production containing an organic semiconductor material in a high concentration and being excellent in coatability, drying property, safety, dispersibility, solubility and the like to be formed.

In order to more enhance coatability, it is effective to use one solvent selected from the (mono, di, tri)alkylene glycol monoalkyl ethers, (mono, di)alkylene glycol dialkyl ethers, (mono, di)alkylene glycol alkyl ether acetates, (mono, di)alkylene glycol diacetates and alkoxycarboxylic acid esters, or a combination of two or more solvents selected therefrom.

In order to more enhance dispersibility of a pigment, it is effective to use one solvent selected from mono-$C_{3-6}$ alkylene glycol alkyl ether acetates such as propylene glycol monomethyl ether acetate, and $C_{3-6}$ alkanediol alkyl ether acetates, or a combination of two or more solvents selected therefrom.

In order to more enhance dispersibility of a dye, it is effective to use one solvent selected from mono-$C_{3-6}$ alkylene glycol monoalkyl ethers such as propylene glycol monomethyl ether, mono-$C_{3-6}$ alkylene glycol alkyl ether acetates such as propylene glycol monomethyl ether acetate, $C_{3-6}$ alkanediol monoalkyl ethers, $C_{3-6}$ alkanediol alkyl ether acetates, hydroxycarboxylic acid esters, hydroxycarboxylic acid diesters, $C_{3-6}$ alcohols, and $C_{3-6}$ alkanediols, or a combination of two or more solvents selected therefrom.

In order to more enhance solubility of an epoxy resin or an acrylic resin, it is effective to use one solvent selected from (mono, di, tri)alkylene glycol monoalkyl ethers, (mono, di)alkylene glycol dialkyl ethers, (mono, di)alkylene glycol alkyl ether acetates, (mono, di)alkylene glycol diacetates, cyclic ketones, lactones, cyclic ethers, amides, pyridines, aromatic acetates and amines, or a combination of two or more solvents selected therefrom.

In order to more enhance drying property, it is effective to use one solvent selected from (mono, di)$C_{3-6}$ alkylene glycol $C_{1-2}$ alkyl $C_{3-4}$ alkyl ethers such as propylene glycol methyl n-propyl ether, propylene glycol methyl n-butyl ether, dipropylene glycol methyl n-propyl ether and dipropylene glycol methyl n-butyl ether, and (cyclo)alkyl acetates, or a combination of two or more solvents selected therefrom.

When the solvent A and the solvent B are used in combination, the mixing ratio thereof (former/latter (weight ratio)) is, for example, 95/5 to 50/50, preferably 95/5 to 70/30. If the proportion of the solvent B is higher than that of the solvent A, the solubility of the organic semiconductor material tends to be reduced. Herein, when two or more solvents are used in combination as the solvent A, the amount of the solvent A used corresponds to the total amount. Much the same is true on the solvent B.

The solvent or solvent composition for organic transistor production according to the present invention contains the solvent A, and thus has a high solubility of the organic semiconductor material even at relatively low temperatures. For example, the solubility of the compound represented by the formula (1) at 100° C. is, for example, not less than 0.02 parts by weight, preferably not less than 0.03 parts by weight, particularly preferably not less than 0.04 parts by weight based on 100 parts by weight of the solvent or solvent composition for organic transistor production. The upper limit of the solubility is, for example, 5 parts by weight, preferably 2 parts by weight, particularly preferably 1 part by weight.

In addition, the solubility of the compound represented by the formula (2) at 100° C. is, for example, not less than 4.0 parts by weight, preferably not less than 4.25 parts by weight, particularly preferably not less than 4.5 parts by weight based on 100 parts by weight of the solvent or solvent composition for organic transistor production. The upper limit of the solubility is, for example, 8 parts by weight, preferably 7 parts by weight, particularly preferably 6 parts by weight.

In addition, the solubility of the compound represented by the formula (3) at 100° C. is, for example, not less than 0.05 parts by weight, preferably not less than 0.06 parts by weight, particularly preferably not less than 0.07 parts by weight based on 100 parts by weight of the solvent or solvent composition for organic transistor production. The upper limit of the solubility is, for example, 0.5 parts by weight, preferably 0.2 parts by weight, particularly preferably 0.1 parts by weight.

In addition, the solubility of the compound represented by the formula (4) at 100° C. is, for example, not less than 0.08 parts by weight, preferably not less than 0.1 parts by weight, particularly preferably not less than 0.3 parts by weight based on 100 parts by weight of the solvent or solvent composition for organic transistor production. The upper limit of the solubility is, for example, 3 parts by weight, preferably 2 parts by weight, particularly preferably 1 part by weight.

(Organic Semiconductor Material)

The solvent or solvent composition for organic transistor production according to the present invention is a solvent or solvent composition for organic semiconductor material dissolution. The organic semiconductor material is not particularly limited, but is preferably at least one compound selected from the compounds represented by the formula (1), formula (2), formula (3) and formula (4) in the present invention.

In the formula (1), $R^{11}$ and $R^{12}$ are the same or different, and represent a hydrogen atom, or a silylethynyl group optionally having a substituent. In the formula (2), $R^{13}$, $R^{14}$, $R^{15}$ and $R^{16}$ represent a phenyl group optionally having a substituent, or $R^{13}$ and $R^{14}$, and/or $R^{15}$ and $R^{16}$ are bound to each other to form a disulfide bond or an imide bond. In the formula (3), $R^{17}$ and $R^{18}$ are the same or different, and represent a hydrogen atom, a $C_{1-18}$ alkyl group optionally having a substituent, a phenyl group optionally having a substituent, a naphthyl group optionally having a substituent or a thiophenyl group optionally having a substituent. In the formula (4), $R^{19}$ and $R^{20}$ are the same or different, and represent a hydrogen atom, a $C_{1-18}$ alkyl group optionally having a substituent, a phenyl group optionally having a substituent, a naphthyl group optionally having a substituent or a thiophenyl group optionally having a substituent.

Examples of the substituent that the silylethynyl group in $R^{11}$ and $R^{12}$ may have can include straight or branched alkyl groups having 1 to 12 carbon atoms, such as methyl, ethyl, n-propyl, isopropyl, n-butyl, sec-butyl and t-butyl groups.

Examples of the substituent that the phenyl group in $R^{13}$, $R^{14}$, $R^{15}$ and $R^{16}$ may have can include straight or branched alkyl groups having 1 to 12 carbon atoms, such as methyl, ethyl, n-propyl, isopropyl, n-butyl, sec-butyl and t-butyl groups.

Examples of the $C_{1-18}$ alkyl group in $R^{17}$, $R^{18}$, $R^{19}$ and $R^{20}$ can include straight or branched alkyl groups such as methyl, ethyl, propyl, butyl, pentyl, hexyl, octyl, ethylhexyl, decyl, dodecyl, myristyl, hexyldecyl and octyldecyl groups. Examples of the substituent that the $C_{1-18}$ alkyl group may have can include $C_{6-10}$ aryl groups such as phenyl and naphthyl groups. Examples of the substituent that the phenyl group, naphthyl group and thiophenyl group may have can include straight or branched alkyl groups having 1 to 12 carbon atoms, such as methyl, ethyl, n-propyl, isopropyl, n-butyl, sec-butyl and t-butyl groups.

As the organic semiconductor material in the present invention, in particular, at least one compound selected from compounds represented by the following formulae (1-1), (2-1), (2-2), (2-3), (3-1) and (4-1) is preferably used because an organic transistor having a large crystal grain is obtained.

[Formula 4]

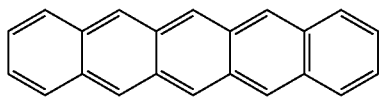

(1-1)

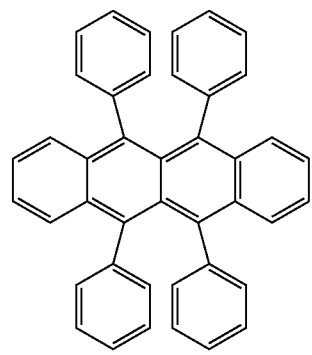

(2-1)

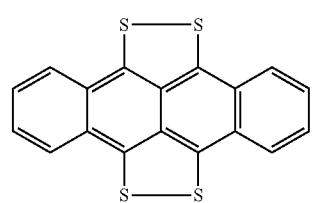

(2-2)

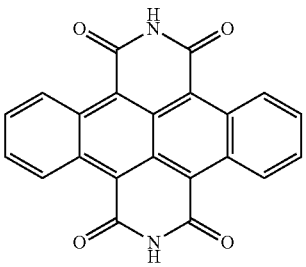

(2-3)

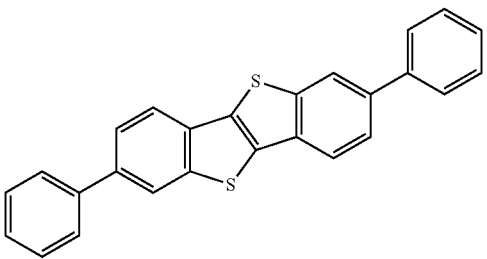

(3-1)

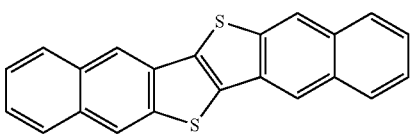

(4-1)

[Composition for Organic Transistor Production]

The composition for organic transistor production according to the present invention includes the organic semiconductor material, and the solvent or solvent composition for organic transistor production.

The composition for organic transistor production according to the present invention can be prepared by, for example, mixing the organic semiconductor material, and the solvent or solvent composition for organic transistor production, and heating the mixture in a nitrogen atmosphere under a light-shielding condition at a temperature of about 70 to 150° C. for about 0.1 to 10 hours.

When the compound represented by the formula (1) is used as the organic semiconductor material, the content of the organic semiconductor material in the composition for organic transistor production according to the present invention is, for example, not less than 0.02 parts by weight, preferably not less than 0.03 parts by weight, particularly preferably not less than 0.04 parts by weight based on 100 parts by weight of the solvent or solvent composition for organic transistor production. The upper limit is, for example, 5 parts by weight, preferably 2 parts by weight, particularly preferably 1 part by weight.

When the compound represented by the formula (2) is used as the organic semiconductor material, the content is, for example, not less than 0.01 parts by weight, preferably not less than 0.02 parts by weight, further preferably not less than 0.2 parts by weight, particularly preferably not less than 2 parts by weight, most preferably not less than 4.5 parts by weight based on 100 parts by weight of the solvent or solvent composition for organic transistor production. The upper limit is, for example, 8 parts by weight, preferably 7 parts by weight, particularly preferably 6 parts by weight.

When the compound represented by the formula (3) is used as the organic semiconductor material, the content is, for example, not less than 0.01 parts by weight, preferably not less than 0.05 parts by weight, particularly preferably not less than 0.07 parts by weight based on 100 parts by weight of the solvent or solvent composition for organic transistor production. The upper limit is, for example, 0.5 parts by weight, preferably 0.2 parts by weight, particularly preferably 0.1 parts by weight.

When the compound represented by the formula (4) is used as the organic semiconductor material, the content is, for example, not less than 0.08 parts by weight, preferably not less than 0.1 parts by weight, particularly preferably not less than 0.3 parts by weight based on 100 parts by weight of the solvent or solvent composition for organic transistor production. The upper limit is, for example, 3 parts by weight, preferably 2 parts by weight, particularly preferably 1 part by weight.

The content of the solvent or solvent composition for organic transistor production in the composition for organic transistor production according to the present invention is, for example, not more than 99.99% by weight. The lower limit thereof is, for example, 92.00% by weight, preferably 95.00% by weight, particularly preferably 95.50% by weight, and the upper limit thereof is preferably 99.98% by weight, particularly preferably 99.96% by weight.

The amount of the solvent or solvent composition for organic transistor production included in the composition for organic transistor production according to the present invention is, for example, preferably not less than 20 times (by weight), further preferably not less than 25 times (by weight), particularly preferably not less than 50 times (by weight), most preferably not less than 100 times (by weight) that of the compound represented by the formula (1) as the organic semiconductor material, because crystallization of the organic semiconductor material by self-organizing action can be promoted. The upper limit is, for example, 5000 times (by weight), preferably 3333 times (by weight), particularly preferably 2500 times (by weight).

The amount is, for example, preferably not less than 12.5 times (by weight), further preferably not less than 14.3 times (by weight), particularly preferably not less than 16.7 times (by weight) that of the compound represented by the formula (2) as the organic semiconductor material. The upper limit is, for example, 28.6 times (by weight), preferably 25 times (by weight), particularly preferably 22.2 times (by weight).

The amount is, for example, preferably not less than 200 times (by weight), further preferably not less than 500 times (by weight), particularly preferably not less than 1000 times (by weight) that of the compound represented by the formula (3) as the organic semiconductor material. The upper limit is, for example, 2000 times (by weight), preferably 1667 times (by weight), particularly preferably 1429 times (by weight).

The amount is, for example, preferably not less than 32 times (by weight), further preferably not less than 49 times (by weight), particularly preferably not less than 99 times (by weight) that of the compound represented by the formula (4) as the organic semiconductor material. The upper limit is, for example, 1249 times (by weight), preferably 999 times (by weight), particularly preferably 332 times (by weight).

In the composition for organic transistor production according to the present invention, other components (for example, an epoxy resin, an acrylic resin, a cellulose resin and a butyral resin) included in a general composition for organic transistor production can be, if necessary, appropriately compounded in addition to the organic semiconductor material and the solvent or solvent composition for organic transistor production.

The composition for organic transistor production according to the present invention can dissolve the organic semiconductor material in a high concentration even at relatively low temperatures. Therefore, an organic transistor can be directly formed even on a plastic substrate that is low in heat resistance, but is high in impact resistance, light in weight and flexible as compared with a glass substrate, forming a display and computer equipment that are high in impact resistance, light in weight and flexible. The composition for organic transistor production according to the present invention includes the solvent or solvent composition for organic transistor production according to the present invention, and thus, when a substrate is coated with the composition for organic transistor production, the organic semiconductor material is crystallized by self-organizing action, providing an organic transistor having a high crystallinity. Furthermore, an organic transistor can be easily formed by a simple method by means of a wet process such as a printing method or a spin coat method, resulting in a significant reduction in cost.

EXAMPLES

Hereinafter, the present invention is more specifically described with reference to Examples, but the present invention is not limited to these Examples.

Example 1

Pentacene (compound represented by formula (1-1)) (produced by Tokyo Chemical Industry Co., Ltd.) was used as an organic semiconductor material, and 1,1,3,3-tetramethylurea was used as a solvent for organic transistor production under an environment of 20° C., providing a mixture including the organic semiconductor material in a concentration of 0.02% by weight to 0.05% by weight. The resulting mixture was heated in a nitrogen atmosphere under a light-shielding condition at 100° C. for about 6 hours, preparing a composition for organic transistor production. With respect to the resulting composition for organic transistor production, the solubility of the organic semiconductor material was observed. Herein, the solubility was visually evaluated, and a case where no insoluble material was observed was rated as "○: dissolution", and a case where an insoluble material was observed was rated as "x: not dissolution". The same shall apply hereafter.

Examples 2 to 3 and Comparative Examples 1 to 2

Each composition for organic transistor production was prepared in the same manner as in Example 1 except that each solvent for organic transistor production shown in Table 1 was used, and the solubility of the organic semiconductor material was evaluated.

TABLE 1

|  | Solvent for organic transistor production | Pentacene concentration (wt %) | | | |
|---|---|---|---|---|---|
|  |  | 0.02 | 0.03 | 0.04 | 0.05 |
| Example 1 | TMU | ○ | ○ | ○ | ○ |
| Example 2 | DMI | ○ | ○ | ○ | ○ |
| Example 3 | DMTHP | ○ | ○ | ○ | ○ |
| Comparative Example 1 | Tetralin | x | x | x | x |

TABLE 1-continued

| | Solvent for organic transistor production | Pentacene concentration (wt %) | | | |
|---|---|---|---|---|---|
| | | 0.02 | 0.03 | 0.04 | 0.05 |
| Comparative Example 2 | 1,2,4-TCB | ○ | x | x | x |

TMU: 1,1,3,3-tetramethylurea (produced by Wako Pure Chemical Industries, Ltd.)
DMI: 1,3-dimethyl-2-imidazolidinone (produced by Wako Pure Chemical Industries, Ltd.)
DMTHP: 1,3-dimethyl-3,4,5,6-tetrahydro-2(1H)-pyrimidinone (produced by Wako Pure Chemical Industries, Ltd.)
Tetralin: tetralin (produced by Wako Pure Chemical Industries, Ltd.)
1,2,4-TCB: 1,2,4-trichlorobenzene (produced by Tokyo Chemical Industry Co., Ltd.)

Examples 4 to 5 and Comparative Examples 3 to 4

Rubrene (compound represented by formula (2-1)) (produced by Tokyo Chemical Industry Co., Ltd.) was used as an organic semiconductor material, and each solvent for organic transistor production shown in Table 2 was used under an environment of 20° C., providing a mixture including the organic semiconductor material in a concentration of 4.00% by weight to 5.00% by weight. The resulting mixture was heated in a nitrogen atmosphere under a light-shielding condition at 100° C. for about 2 hours, preparing a composition for organic transistor production. With respect to the resulting composition for organic transistor production, the solubility of the organic semiconductor material was observed.

TABLE 2

| | Solvent for organic transistor production | Rubrene concentration (wt %) | | | | |
|---|---|---|---|---|---|---|
| | | 4.00 | 4.25 | 4.50 | 4.75 | 5.00 |
| Example 4 | DMI | ○ | ○ | ○ | x | x |
| Example 5 | DMTHP | ○ | ○ | ○ | ○ | ○ |
| Comparative Example 3 | Tetralin | ○ | x | x | x | x |
| Comparative Example 4 | 1,2,4-TCB | ○ | ○ | x | x | x |

Examples 6 to 8 and Comparative Examples 5 to 6

2,7-Diphenyl[1]benzothieno[3,2-b][1]benzothiophene (DPh-BTBT: compound represented by formula (3-1)) (produced by Tokyo Chemical Industry Co., Ltd.) was used as an organic semiconductor material, and each solvent for organic transistor production shown in Table 3 was used under an environment of 20° C., providing a mixture including the organic semiconductor material in a concentration of 0.05% by weight to 0.10% by weight. The resulting mixture was heated in a nitrogen atmosphere under a light-shielding condition at 100° C. for about 2 hours, preparing a composition for organic transistor production. With respect to the resulting composition for organic transistor production, the solubility of the organic semiconductor material was observed.

TABLE 3

| | Solvent for organic transistor production | DPh-BTBT concentration (wt %) | | | |
|---|---|---|---|---|---|
| | | 0.05 | 0.06 | 0.07 | 0.10 |
| Example 6 | TMU | ○ | ○ | ○ | x |
| Example 7 | DMI | ○ | ○ | ○ | ○ |
| Example 8 | DMTHP | ○ | ○ | ○ | ○ |
| Comparative Example 5 | Tetralin | x | x | x | x |
| Comparative Example 6 | 1,2,4-TCB | ○ | ○ | x | x |

Examples 9 to 11 and Comparative Examples 7 to 8

Dinaphtho[2,3-b:2',3'-f]thieno[3,2-b]thiophene (DNTT: compound represented by formula (4-1)) (produced by Luminescence Technology Corp.) was used as an organic semiconductor material, and each solvent for organic transistor production shown in Table 4 was used under an environment of 20° C., providing a mixture including the organic semiconductor material in a concentration of 0.07% by weight to 0.30% by weight. The resulting mixture was heated in a nitrogen atmosphere under a light-shielding condition at 100° C. for about 2 hours, preparing a composition for organic transistor production. With respect to the resulting composition for organic transistor production, the solubility of the organic semiconductor material was observed.

TABLE 4

| | Solvent for organic transistor production | DNTT concentration (wt %) | | | |
|---|---|---|---|---|---|
| | | 0.07 | 0.08 | 0.10 | 0.30 |
| Example 9 | TMU | ○ | ○ | x | x |
| Example 10 | DMI | ○ | ○ | ○ | x |
| Example 11 | DMTHP | ○ | ○ | ○ | ○ |
| Comparative Example 7 | Tetralin | x | x | x | x |
| Comparative Example 8 | 1,2,4-TCB | ○ | x | x | x |

As is clear from Examples, 1,1,3,3-tetramethylurea, 1,3-dimethyl-2-imidazolidinone and 1,3-dimethyl-3,4,5,6-tetrahydro-2(1H)-pyrimidinone are better in solubility of pentacene (compound represented by formula (1-1)), DPh-BTBT (compound represented by formula (3-1)) and DNTT (compound represented by formula (4-1)) than tetralin and 1,2,4-trichlorobenzene.

In addition, 1,3-dimethyl-2-imidazolidinone and 1,3-dimethyl-3,4,5,6-tetrahydro-2(1H)-pyrimidinone are excellent in solubility of Rubrene (compound represented by formula (2-1)) than tetralin and 1,2,4-trichlorobenzene.

INDUSTRIAL APPLICABILITY

The solvent or solvent composition for organic transistor production according to the present invention has a high solubility of an organic semiconductor material even at relatively low temperatures. Therefore, an organic transistor can be directly formed even on a plastic substrate or the like that is low in heat resistance, but is high in impact resistance, light in weight and flexible as compared with a glass substrate that is high in heat resistance, but is low in impact resistance, difficult to be lighter and poor in flexibility, forming a display and computer equipment that are high in impact resistance, light in weight and flexible. In addition, an organic transistor can be easily produced by a simple method by means of a wet process such as a printing method or a spin coat method, resulting in a significant reduction in cost.

The invention claimed is:

1. A composition for organic transistor production, said composition comprising:
    an organic semiconductor material, wherein the organic semiconductor material is at least one compound selected from compounds represented by the following formula (3) and formula (4):

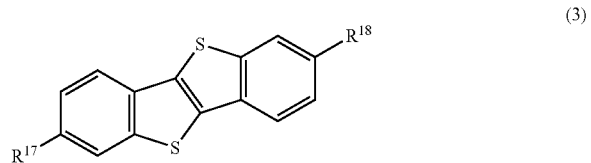

(3)

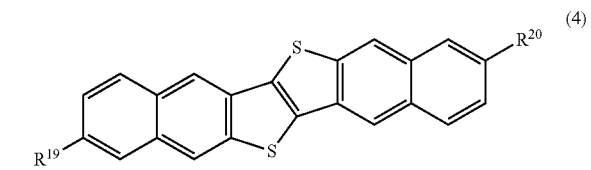

(4)

wherein
    in formula (3), $R^{17}$ and $R^{18}$ are the same or different, and each represents a hydrogen atom, a $C_{1-18}$ alkyl group optionally having a substituent, a phenyl group, a naphthyl group optionally having a substituent, or a thiophenyl group optionally having a substituent, and
    in formula (4), $R^{19}$ and $R^{20}$ are the same or different, and each represents a hydrogen atom, a $C_{1-18}$ alkyl group optionally having a substituent, a phenyl group optionally having a substituent, a naphthyl group optionally having a substituent, or a thiophenyl group optionally having a substituent; and
    a solvent or solvent composition for organic transistor production, wherein the solvent or solvent composition for organic transistor production is used for organic semiconductor material dissolution, and comprises a solvent A being at least one compound selected from the group consisting of
1,1,3,3-tetramethylurea and
1,3-dimethyl-3,4,5,6-tetrahydro-2(1H)-pyrimidinone,
    wherein the content of the solvent A in the solvent or solvent composition for organic transistor production is not less than 70% by weight.

2. A composition for organic transistor production, said composition comprising:
    an organic semiconductor material, wherein the organic semiconductor material is a compound represented by formula (4):

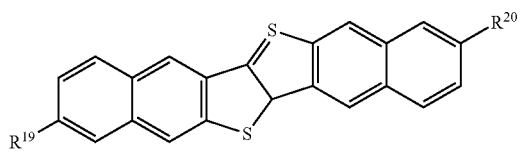

(4)

wherein $R^{19}$ and $R^{20}$ are the same or different, and each represents a hydrogen atom, a $C_{1-18}$ alkyl group optionally having a substituent, a phenyl group optionally having a substituent, a naphthyl group optionally having a substituent, or a thiophenyl group optionally having a substituent; and
    a solvent or solvent composition for organic transistor production, wherein the solvent or solvent composition for organic transistor production is used for organic semiconductor material dissolution, and comprises a solvent A represented by the following formula (A):

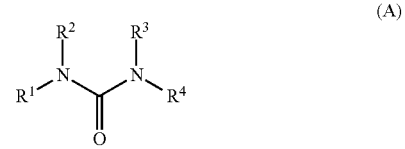

(A)

wherein $R^1$ to $R^4$ are the same or different and each represents a $C_{1-2}$ alkyl group and $R^1$ and $R^4$ may be bonded to each other to form a ring together with —N($R^2$)—C(=O)—N($R^3$)— in the formula, wherein the content of the solvent (A) in said solvent or solvent composition for organic transistor production is not less than 70% by weight.

3. A composition for organic transistor production, said composition comprising:
    an organic semiconductor material, wherein the organic semiconductor material is at least one compound selected from compounds represented by the following formulae (3) and (4):

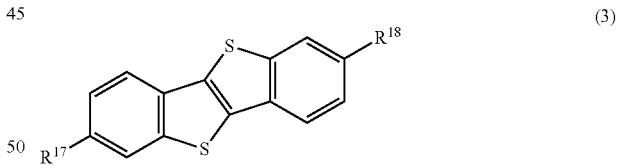

(3)

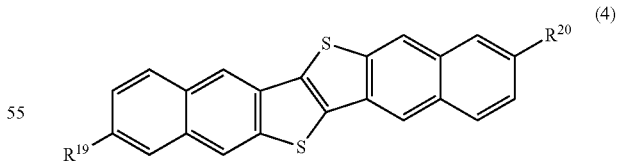

(4)

wherein
    in formula (3), $R^{17}$ and $R^{18}$ are the same or different, and each represents a hydrogen atom, a $C_{1-18}$ alkyl group optionally having a substituent, a phenyl group, a naphthyl group optionally having a substituent, or a thiophenyl group optionally having a substituent, and
    in formula (4), $R^{19}$ and $R^{20}$ are the same or different, and each represents a hydrogen atom, a $C_{1-18}$ alkyl group optionally having a substituent, a phenyl group optionally having a substituent, a naphthyl group optionally having a substituent, or a thiophenyl group optionally having a substituent; and a solvent or solvent composition for organic transistor production, wherein the solvent or solvent composition for organic transistor production is used for organic semiconductor material dissolution, and comprises 1,3-dimethyl-3,4,5,6-tetrahydro-2(1H)-pyrimidinone as a solvent A, wherein the content of the solvent A in the solvent or solvent composition for organic transistor production is not less than 70% by weight.

4. The composition for organic transistor production according to claim 1, wherein the organic semiconductor material is a compound represented by formula (4).

5. The composition for organic transistor production according to claim 3, wherein the organic semiconductor material is a compound represented by formula (4).

6. The composition for organic transistor production according to claim 1, wherein said solvent or solvent composition for organic transistor production is a solvent composition which comprises said solvent A and a solvent B comprising a (mono, di, tri)alkylene glycol monoalkyl ether, a (mono, di)alkylene glycol dialkyl ether, a (mono, di)alkylene glycol alkyl ether acetate, a (mono, di)alkylene glycol diacetate, a (cyclo)alkyl acetate, a $C_{3-6}$ alcohol, a $C_{3-6}$ alkanediol, a $C_{3-6}$ alkanediol monoalkyl ether, a $C_{3-6}$ alkanediol alkyl ether acetate, a $C_{3-6}$ alkanediol diacetate, glycerin triacetate, a hydroxycarboxylic acid ester, a hydroxycarboxylic acid diester, an alkoxycarboxylic acid esters, a cyclic ketone, a lactone, a cyclic ether, an amides, a pyridine, an aromatic acetate, an amine, or a combination thereof.

7. The composition for organic transistor production according to claim 2, wherein said solvent or solvent composition for organic transistor production is a solvent composition which comprises said solvent A and a solvent B comprising a (mono, di, tri)alkylene glycol monoalkyl ether, a (mono, di)alkylene glycol dialkyl ether, a (mono, di)alkylene glycol alkyl ether acetate, a (mono, di)alkylene glycol diacetate, a (cyclo)alkyl acetate, a $C_{3-6}$ alcohol, a $C_{3-6}$ alkanediol, a $C_{3-6}$ alkanediol monoalkyl ether, a $C_{3-6}$ alkanediol alkyl ether acetate, a $C_{3-6}$ alkanediol diacetate, glycerin triacetate, a hydroxycarboxylic acid ester, a hydroxycarboxylic acid diester, an alkoxycarboxylic acid esters, a cyclic ketone, a lactone, a cyclic ether, an amides, a pyridine, an aromatic acetate, an amine, or a combination thereof.

8. The composition for organic transistor production according to claim 3, wherein said solvent or solvent composition for organic transistor production is a solvent composition which comprises said solvent A and a solvent B comprising a (mono, di, tri)alkylene glycol monoalkyl ether, a (mono, di)alkylene glycol dialkyl ether, a (mono, di)alkylene glycol alkyl ether acetate, a (mono, di)alkylene glycol diacetate, a (cyclo)alkyl acetate, a $C_{3-6}$ alcohol, a $C_{3-6}$ alkanediol, a $C_{3-6}$ alkanediol monoalkyl ether, a $C_{3-6}$ alkanediol alkyl ether acetate, a $C_{3-6}$ alkanediol diacetate, glycerin triacetate, a hydroxycarboxylic acid ester, a hydroxycarboxylic acid diester, an alkoxycarboxylic acid esters, a cyclic ketone, a lactone, a cyclic ether, an amides, a pyridine, an aromatic acetate, an amine, or a combination thereof.

* * * * *